United States Patent
Sun et al.

(10) Patent No.: US 11,361,730 B2
(45) Date of Patent: Jun. 14, 2022

(54) DISPLAY DEVICE, METHOD OF AUTOMATICALLY ADJUSTING BRIGHTNESS OF DISPLAY SCREEN, AND TERMINAL EQUIPMENT

(71) Applicant: BOE TECHNOLOGY GROUP CO., LTD., Beijing (CN)

(72) Inventors: Yanliu Sun, Beijing (CN); Kuo Sun, Beijing (CN); Ming Che Hsieh, Beijing (CN); Fei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 357 days.

(21) Appl. No.: 16/490,620

(22) PCT Filed: Feb. 2, 2019

(86) PCT No.: PCT/CN2019/074609
§ 371 (c)(1),
(2) Date: Sep. 3, 2019

(87) PCT Pub. No.: WO2019/227967
PCT Pub. Date: Dec. 5, 2019

(65) Prior Publication Data
US 2021/0358453 A1    Nov. 18, 2021

(30) Foreign Application Priority Data
May 30, 2018  (CN) .......................... 201810539342.9

(51) Int. Cl.
*G09G 5/10* (2006.01)
*H01L 27/32* (2006.01)

(52) U.S. Cl.
CPC ....... *G09G 5/10* (2013.01); *G09G 2320/0626* (2013.01); *G09G 2360/141* (2013.01); *G09G 2360/144* (2013.01); *H01L 27/3269* (2013.01)

(58) Field of Classification Search
None
See application file for complete search history.

(56) References Cited

U.S. PATENT DOCUMENTS 10,520,359 B2    12/2019  Wang
2009/0179880 A1   7/2009  Nakajima et al.
(Continued)

FOREIGN PATENT DOCUMENTS

CN    101488301 A    7/2009
CN    104009185      8/2014
(Continued)

OTHER PUBLICATIONS

Chinese Office Action dated Aug. 3, 2020 corresponding to Chinese Patent Application No. 201810539342.9; 16 pages.
(Continued)

*Primary Examiner* — Aneeta Yodichkas
(74) *Attorney, Agent, or Firm* — Leason Ellis LLP

(57) ABSTRACT

A display device, a method for automatically adjusting brightness of a display screen and a terminal equipment are provided. An ambient light detection device is integrated in an operable region of the display device. The ambient light detection device includes a light blocking layer and a photoelectric sensor. The display device includes a display assembly and a control device. The display assembly includes a backpanel assembly, the light blocking layer being arranged in the backpanel assembly and provided with a light passing hole suitable for the passing of ambient light, the photoelectric sensor being disposed under the backpanel assembly; a display screen disposed over the backpanel assembly; a display chip connected to the display screen; and a control device connected to the photoelectric sensor.

(Continued)

The display chip is connected to the control device, to adjust brightness of the display screen according to variance of the ambient light.

19 Claims, 8 Drawing Sheets

(56) References Cited

U.S. PATENT DOCUMENTS

| | | |
|---|---|---|
| 2010/0253660 A1 | 10/2010 | Hashimoto |
| 2014/0132158 A1 | 5/2014 | Land et al. |
| 2015/0112633 A1 | 4/2015 | Lee et al. |
| 2019/0080668 A1* | 3/2019 | Holenarsipur ........ G01J 1/4204 |

FOREIGN PATENT DOCUMENTS

| | | |
|---|---|---|
| CN | 105244006 A | 1/2016 |
| CN | 106462339 A | 2/2017 |
| CN | 106713654 | 5/2017 |
| CN | 107767835 A | 3/2018 |
| CN | 107783221 | 3/2018 |
| CN | 107911506 A | 4/2018 |
| CN | 108766387 A | 11/2018 |
| EP | 3291516 A1 | 3/2018 |

OTHER PUBLICATIONS

Indian Office Action dated Feb. 10, 2021 corresponding to Indian Patent Application No. 201917034357; 6 pages.
Extended European Search Report issued by the European Patent Office for the corresponding European Patent Application No. 19750046.5, dated Feb. 2, 2022. 10 pages.

* cited by examiner

DISPLAY DEVICE, METHOD OF AUTOMATICALLY ADJUSTING BRIGHTNESS OF DISPLAY SCREEN, AND TERMINAL EQUIPMENT

CROSS REFERENCE TO RELATED APPLICATIONS

This application is a U.S. National Stage Application under 35 U.S.C. § 371 of International Patent Application No. PCT/CN2019/074609, filed Feb. 2, 2019, which claims the priority of Chinese patent application No. 201810539342.9 entitled "Display Device, Method of Automatically Adjusting Brightness of Display Screen and Terminal Equipment" filed to CNIPA on May 30, 2018, both of which are incorporated by reference in their entireties.

TECHNICAL FIELD

Embodiments of the present disclosure relate to a display device, a method of automatically adjusting brightness of a display screen of the display device and a terminal equipment for carrying out the method of automatically adjusting brightness of the display screen of the display device.

BACKGROUND

An ambient light detection device is usually arranged in a View area (that is, VA) or a black matrix (BM) area of a display panel, where the BM area usually refers to a non-display area, that is, an AA area, a border region outside of an operable region. However, in the above technical scheme, the ambient light detection device needs to additionally occupy a corresponding region of the display panel, which is adverse to the realization of a borderless screen.

SUMMARY

An embodiment of the present disclosure provides a display device, an ambient light detection device is integrated in a visible area of the display device, which is advantage to the realization of bezel-less of display screen. An embodiment of the present disclosure also provides a method of automatically adjusting brightness of a display screen of the display device.

An embodiment of the present disclosure also provides a terminal equipment for carrying out the method of automatically adjusting brightness of the display screen of the display device.

At least one embodiment of the present disclosure provides a display device, comprising an ambient light detection device including a light blocking layer and a photoelectric sensor, a display assembly, and a control device. The display assembly comprises a backpanel assembly, the light blocking layer being arranged in the backpanel assembly and provided with a light passing hole suitable for the passing of ambient light, the photoelectric sensor being arranged under the backpanel assembly and configured to detect the variance of the ambient light; a display screen provided over the backpanel assembly; a display chip connected with the display screen. The control device is connected with the photoelectric sensor to receive and process an optical signal sensed by the photoelectric sensor, and the display chip is connected with the control device, to adjust brightness of the display screen according to variance of the ambient light.

For example, the backpanel assembly comprises: a substrate, the light blocking layer being disposed on an upper surface of the substrate, and the photoelectric sensor being disposed under the substrate; a light-emitting layer above the light blocking layer; an anode on a lower surface of the light-emitting layer; and a cathode on an upper surface of the light-emitting layer. The light passing hole is configured to allow light emitted by the light-emitting layer not to travel toward the photoelectric sensor via the light passing hole after they are reflected by the cathode, to eliminate interference of light emitted by the light-emitting layer to the ambient light.

For example, when the light emitted by the light-emitting layer is reflected by the cathode to the light blocking layer, for a reflected light that intersects the light blocking layer at the circumference of the light passing hole, a vertical line perpendicular to a plane where the light blocking layer is located is drawn to go through an intersection of the reflected light and the light blocking layer, and an included angle between the vertical line and the reflected light is greater than about 30°.

For example, the backpanel further comprises: a back film on a lower surface of the substrate, the photoelectric sensor being disposed under the back film; and a thin film transistor layer between the light blocking layer and the anode.

For example, the ambient light detection device further comprises a low refractivity layer, the low refractivity layer being arranged between the photoelectric sensor and the substrate, and configured to allow the passing of the ambient light, and to allow light emitted by the light-emitting layer to be totally reflected when it travels toward the low refractivity layer.

For example, the low refractivity layer is a silicon dioxide layer, or the substrate and the photoelectric sensor is bonded and a cavity is defined between the bonded substrate and photoelectric sensor, and the low refractivity layer is an air layer.

For example, the light passing hole is a through hole that runs through the light blocking layer along a thickness direction, and the through hole is formed to be a circle hole or a polygon hole.

For example, a plurality of the light passing holes are provided and arranged in array, and the light passing holes have a maximum radial dimension of about 5 µm to about 15 µm.

For example, the light-emitting layer has a thickness about 1 µm or less.

For example, the display device further comprises a protective layer, a packaging layer, and a pixel definition layer. The protective layer is provided over the ambient light detection device, the packaging layer is provided above the cathode layer, and the pixel definition layer is provided in a same layer as the anode layer.

At least one embodiment of the present disclosure provides a method of automatically adjusting the display screen brightness of the display device, comprising: the photoelectric sensor sensing the ambient light, the control device receiving an optical signal sensed by the photoelectric sensor, and comparing the optical signal with a signal stored in the display chip; determining whether or not an irradiation intensity of the ambient light reaches an adjusting threshold; if yes, sending an adjusting signal from the control device to the display chip, adjusting the driving current of the display screen by the display chip to change brightness of the display screen, and continuing to sense the ambient light by the photoelectric sensor; and if no, returning to continue to sense the ambient light by the photoelectric sensor.

At least one embodiment of the present disclosure also provides a terminal equipment, the terminal equipment being configured to carry out the method of adjusting brightness of the display screen of the display device, the terminal equipment comprises a photoelectric sensor, a display assembly and a control device. Both the photoelectric sensor and the display assembly are electrically connected to the control device, and the display assembly includes a display chip and a display screen. The photoelectric sensor is configured to sense ambient light and acquire an optical signal; the control device is configured to compare the optical signal sensed by the photoelectric sensor with a signal stored in the display chip, and to determine whether or not the irradiation intensity of the ambient light reaches an adjusting threshold, if yes, send an adjusting signal to the display chip; and the display chip is configured to adjust a driving current of the display screen based on the adjusting signal, to change the brightness of the display screen.

For example, the photoelectric sensor is electrically connected to the control device by a sensor flexible circuit board, and the display assembly is electrically connected to the control device by a display flexible circuit board.

BRIEF DESCRIPTION OF THE DRAWINGS

Embodiments of the present disclosure will be described in detail hereinafter in conjunction with accompanying drawings to allow one of ordinary skill in the art to understand the present disclosure more clearly, in which.

DETAILED DESCRIPTION

Technical solutions of the embodiments will be described in a clearly and fully understandable way in connection with the drawings related to the embodiments of the present disclosure. It is apparent that the described embodiments are just a part but not all of the embodiments of the present disclosure. Based on the described embodiments herein, one of ordinary skill in the art can obtain other embodiment(s), without any creative work, which shall be within the scope of the present disclosure.

Unless otherwise defined, all the technical and scientific terms used herein have the same meanings as commonly understood by one of ordinary skill in the art to which the present invention belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right" or the like are only used to indicate relative position relationship, and when the position of the object which is described is changed, the relative position relationship may be changed accordingly.

Embodiments described below by reference to the attached drawings are exemplary, are intended to explain this disclosure, and should not be understood as limitations to this disclosure.

A display device 100 according to an embodiment of the present disclosure will be described below in conjunction with the accompanying drawings.

With respect to a display device 100 according to an embodiment of the present disclosure, in an operable region of the display device 100, an ambient light detection device 1 is integrated. By integrating the ambient light detection device 1 into the operable region of the display device 100, the occupation of a border region around the operable region by the ambient light detection device 1 can be decreased, and it is beneficial to the realization of non-bezel screen.

Hereinafter, an exemplary embodiment of the display device 100 according to the present disclosure will be described in conjunction with the accompanying drawings.

Figure 1:
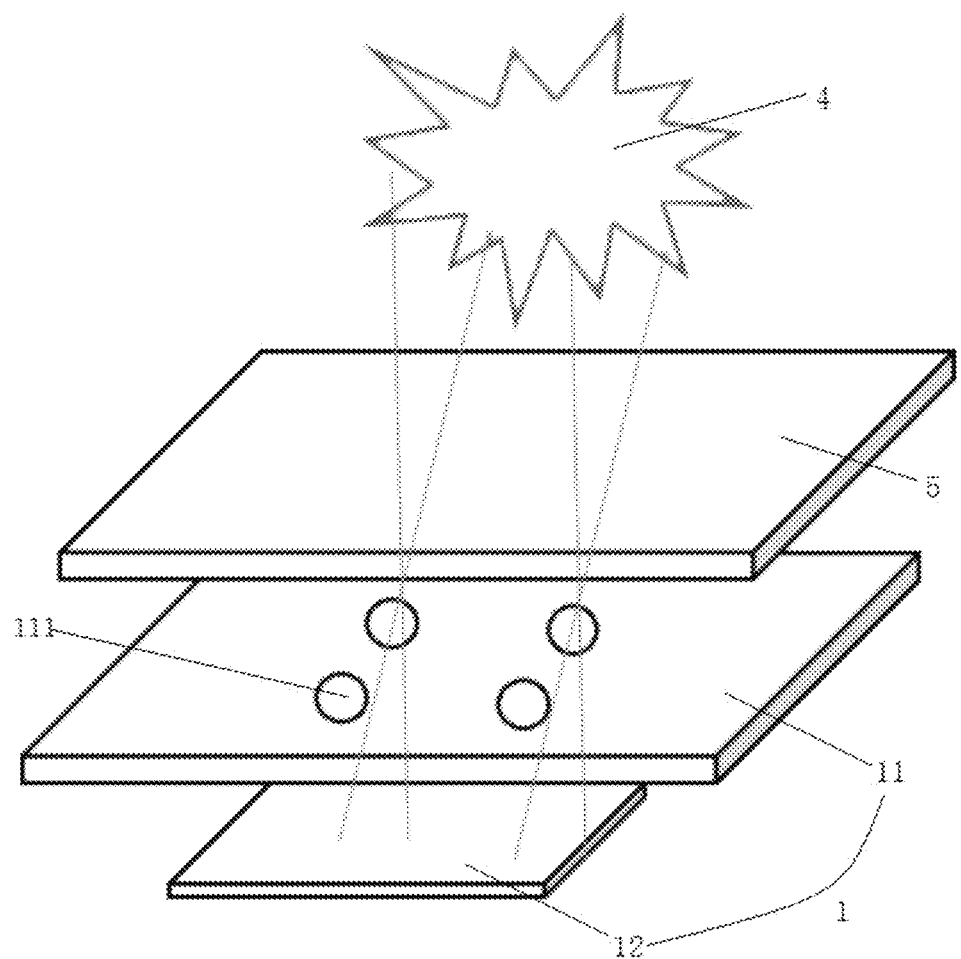
FIG. 1 is a schematic diagram of a display device according to an embodiment of the present disclosure.

Referring to FIG. 1, an ambient light detection device 1 may include a light blocking layer 11 and a photoelectric sensor 12. The light blocking layer 11 may be a metal layer, such as a molybdenum layer, a titanium layer, a silver layer, etc., and the light blocking layer 11 has a thickness which can be set adaptively according to the actual needs.

Figure 2:
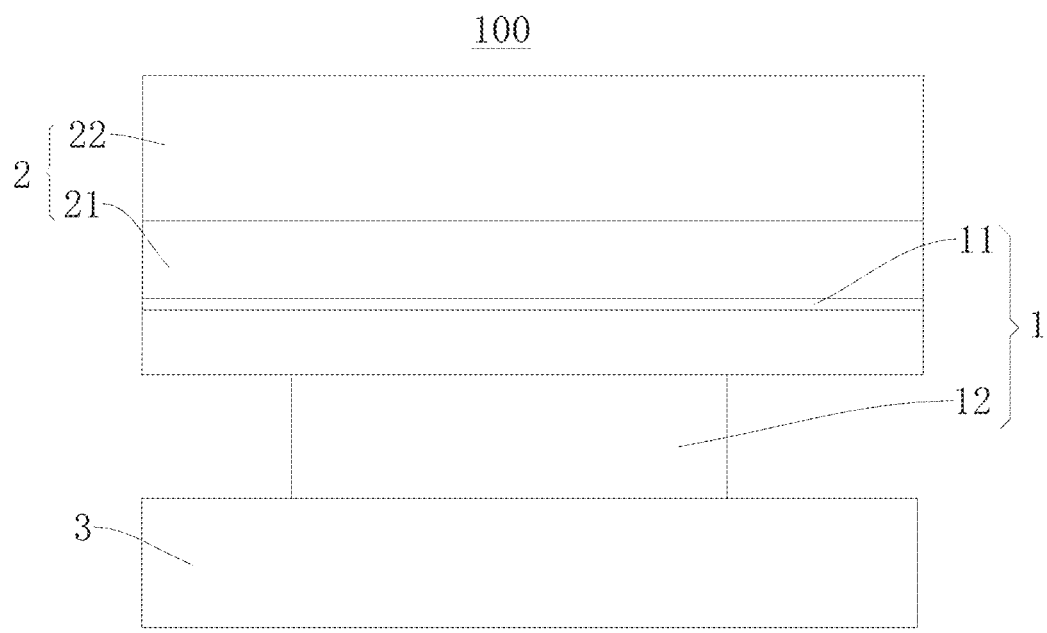
FIG. 2 is another schematic diagram of a display device according to an embodiment of the present disclosure.

Referring to FIG. 2 and with reference to FIG. 1, the display device 100 includes a display assembly 2 and a control device 3. The display assembly 2 includes a backpanel assembly 21, a display screen 22, and a display chip.

For example, the light blocking layer 11 of the ambient light detection device 1 may be arranged in the backpanel assembly 21. The backpanel assembly 21 has a multilayered structure, the light blocking layer 11 belongs to one layer in the multilayered structure; and in the light blocking layer 11, a light passing hole 111 is provided which is suitable for allowing the transmission of ambient light 4. Such an arrangement benefits the accuracy of ambient light detection, and performance of the display device 100 is improved.

The display screen 22 is disposed on the backpanel assembly 21, the display chip is connected to the display screen 22, and the disposing position of the display chip can be selected. The photoelectric sensor 12 is disposed under the backpanel assembly 21 and configured to detect the variance of ambient light 4, and the variance here refers, for example, to a change in the photocurrent of a sensor caused by the ambient light illuminance.

The control device 3 is connected to the photoelectric sensor 12 for receiving and processing an optical signal sensed by the photoelectric sensor 12, and the display chip is coupled to the control device 3, to adjust brightness of the display screen 22 according to variance of ambient light 4. In this way, by integrating the ambient light detection device 1 into the operable region of the display device 100, it is beneficial to reducing occupation of other regions of the display device 100 by the ambient light detection device 1, which contributes to realization of full screen display.

For example, by coupling the control device 3 to the photoelectric sensor 12 and the display chip, respectively, the control device 3 can receive and process an optical signal sensed by the photoelectric sensor 12, and compare the optical signal with an signal stored in the display chip, so that the display chip can adjust brightness of the display screen 22 based on the variance of the ambient light 4. In this way, not only power can be saved, but also the usage comfort of users is improved.

For example, the control device 3 generally includes a Digital Signal Processing chip (DSP), a Printed Circuit Board (PCB), a Central Processing Unit (CPU), a display Integrated Chip (IC).

Figure 15:
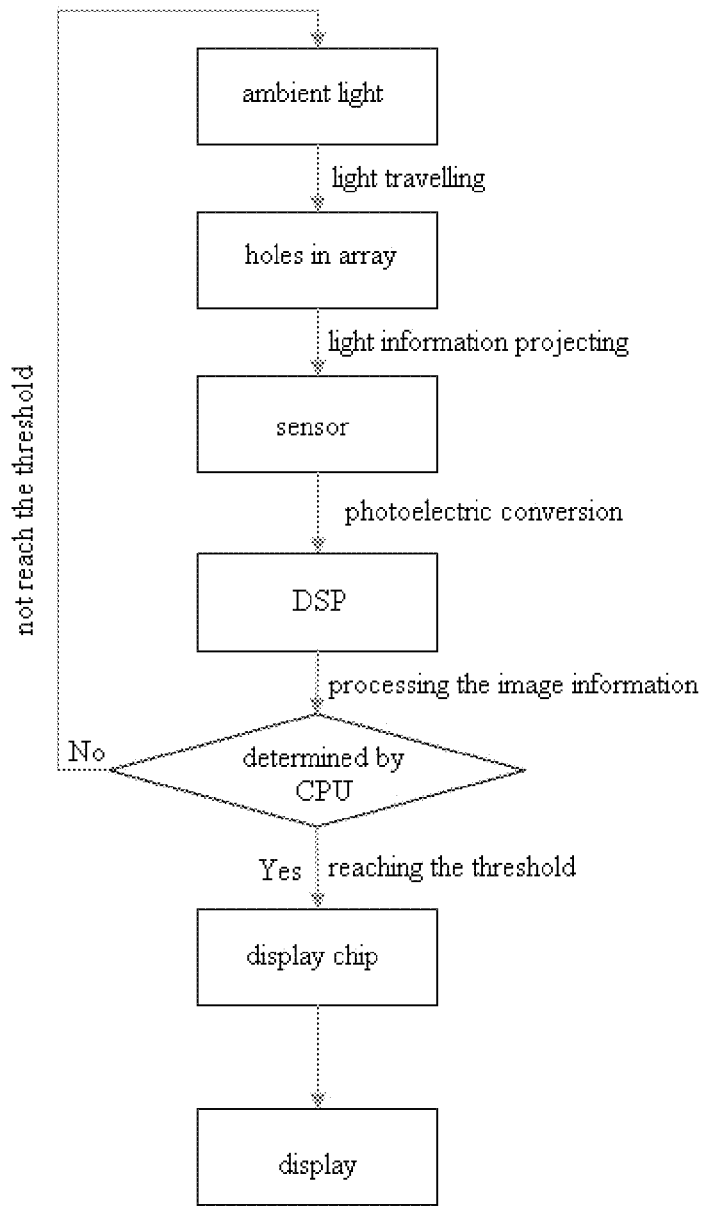
FIG. 15 is a flowchart illustrating operation of a control device according to an embodiment of the present disclosure.

The working process of the control device is shown in FIG. 15. A photoelectric sensor senses an ambient light signal, and the ambient light signal is processed by the DSP (here, which is usually an interpolation fuzzification processing). The processed data is sent to a CPU by PCB, it is determined by the CPU whether or not brightness (or grayscale) of a display screen needs to be adjusted. If it does not reach a threshold, no adjustment is performed, and the operation is interrupted. If it reaches the threshold, adjustment is performed, an adjusting proportion is calculated, and the adjusting data is sent to a display integrated chip (IC). The adjusting data and DATA of the display data are stacked, and then it is sent to the display screen for display. For example, the process may further include that, a grayscale control signal and the display raw data (RAW DATA) are coupled, and the final display data is transmitted to be displayed.

In addition, for example, DSP acts as a digital signal processing chip, which may be contained in a CMOS. The DSP framework includes an ISP (a signal processor).

For example, the DSP framework may further include a JPEG encoder (an image decoder).

According to the display device 100 of the embodiment of the present disclosure, by integrating the ambient light detection device 1 into an operable region of the display device 100, it is beneficial to saving the screen space and improving the screen-to-body ratio, as compared with the prior art. Furthermore, by coupling the control device 3 to the photoelectric sensor 12 and the display chip, respectively, the display device 100 can adjust brightness of the display screen 22 based on the variance of the ambient light 4, and the comfort for the user usage can be improved and energy is saved.

Figure 3:
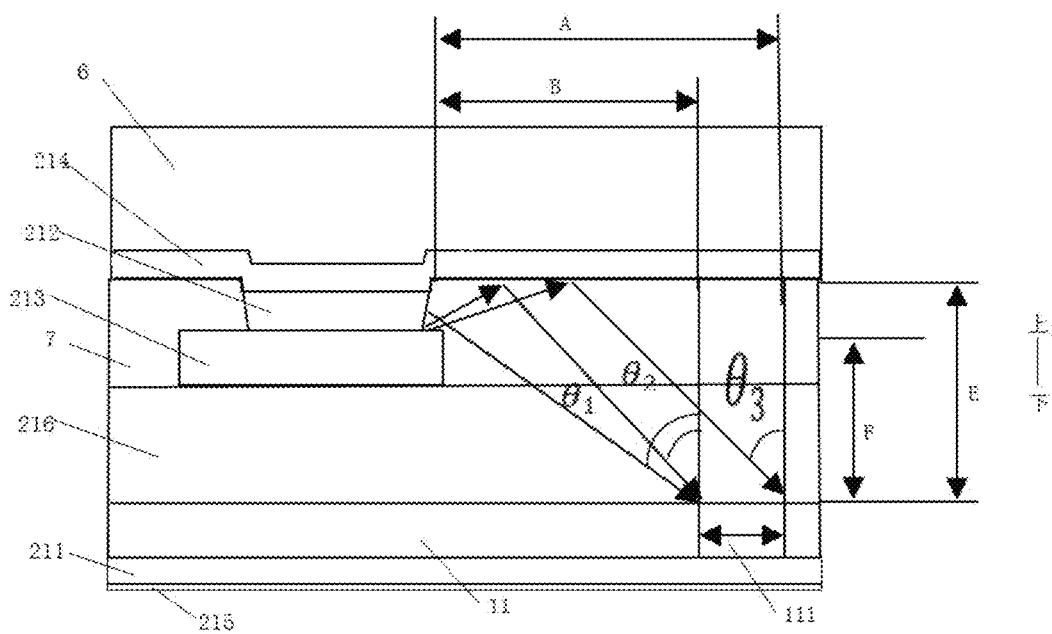
FIG. 3 is still another schematic diagram of a display device according to an embodiment of the present disclosure, where orientation of an arrow in the figure represents the propagating direction of light beams emitted by a light-emitting layer.
Figure 4:
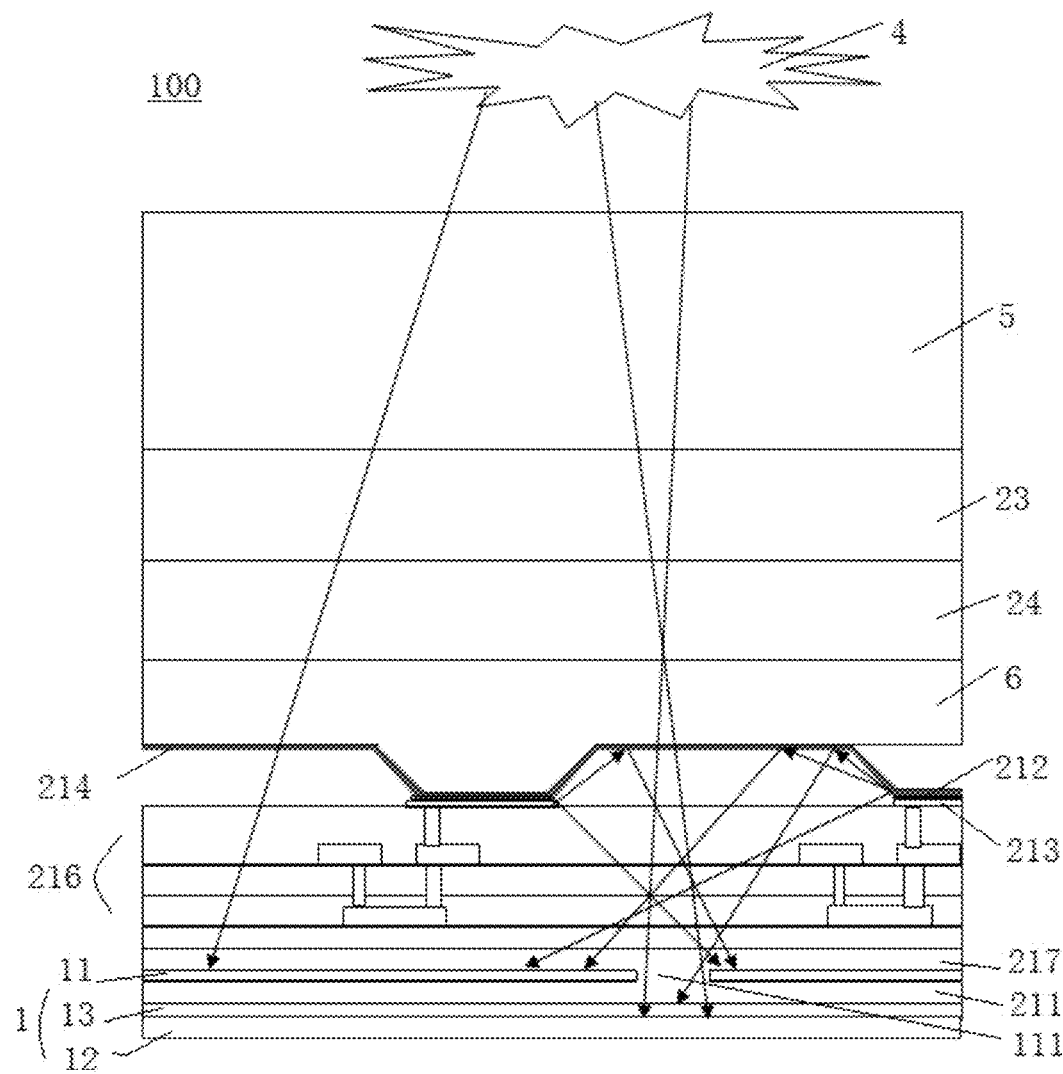
FIG. 4 is yet still another schematic diagram of a display device according to an embodiment of the present disclosure.

For example, with reference to FIG. 3 and FIG. 4, the backpanel assembly 21 includes a substrate 211, a light-emitting layer 212, an anode 213 and a cathode 214.

The light blocking layer 11 is arranged on an upper surface of the substrate 211, and the photoelectric sensor 12 for detecting the variance of ambient light 4 is arranged under the substrate 211; the light-emitting layer 212 is arranged above the light blocking layer 11; the anode 213 is arranged on a lower surface of the light-emitting layer 212; and the cathode 214 (e.g., a metal cathode) is arranged on an upper surface of the light-emitting layer 212.

The light-emitting layer 212 may be an organic Emitting Layer (that is, EL), and a light passing hole 111 is so configured that light emitted by the light-emitting layer 212 will not be exited to the photoelectric sensor 12 via the light passing hole 11 after they are reflected by the cathode 214, so as to eliminate the interference of the light emitted by the light-emitting layer 212 to the ambient light 4. In this way, it is beneficial to avoiding the interference of the light emitted by the light-emitting layer 212 itself to the ambient light 4, and this makes the detection of ambient light be accurate.

The light blocking layer 11 may block part of light, and for example, the light blocking layer 11 may block light emitted by the light-emitting layer 212, helping to reduce the interference of light emitted by the light-emitting layer 212 to the ambient light 4, and to improve the detective accuracy of the photoelectric sensor 12. In turn, brightness of the display screen 22 is adaptively adjusted by the display chip.

For example, the light passing hole 111 is a through hole running through the light blocking layer 11 along the thickness direction, and the through hole is configured into a circle or polygon. In this way, it helps to increase the transmittance, and the interference of light emitted by the light-emitting layer 212 to the ambient light 4 can also be avoided. This makes the detection of ambient light be accurate.

For example, a plurality of light passing holes 111 are provided, and the plurality of light passing holes 111 may be arranged in array. In this way, it is more beneficial to increasing the transmittance, and it also helps to avoid the interference of the light emitted by the light-emitting layer 212 itself to the ambient light 4. This makes the detection of the ambient light be accurate, and the brightness of the screen can be adjusted better.

In order to increase the transmittance, density of the light passing holes 111 may be increased as much as possible. For example, it is possible that a light passing hole 111 is made beside each of subpixels. By designing the ambient light detection device 1 to rest in an operable region, the area of the display screen 22 can be increased, and a larger screen-to-body ratio can be achieved.

It is to be understood that, for example, the operable region may be disposed in a display region. For example, a hole array may be formed on the full screen, and a hole or hole array may also be formed in some region of the screen. If it is made on the full screen, the whole screen may be called as an operating region. If it is only made in some region, owing to the fact that a sensor is relatively small, the sensor needs to be placed in a region where a hole array has been made. In this way, this partial region may be called as an operable region.

For example, by integrating the ambient light detection device 1 into an operable region and automatically adjusting the screen brightness according to the ambient light, extra space can be saved. The screen area is increased, and the screen-to-body ratio is raised, which is beneficial to the realization of full screen display.

In addition, by providing the light blocking layer 11 and forming the light passing hole 111 in the light blocking layer 11, the interference of the light by the light-emitting layer 212 itself to the photoelectric sensor 12 for detecting the ambient light 4 is avoided. This makes the detection of ambient light be accurate, and a full-screen fingerprint identification can be realized. It is understandable that, regarding the process of fingerprint identification, reference may be made to a conventional fingerprint identification ways, and no description is repeated here.

Optionally, the maximum radial dimension of a light passing hole 111 is about 5 μm to about 15 μm. In this way, by setting the maximum radial dimension of the light passing hole 111 to be in the range of about 5 μm to about 15 μm, it is more beneficial to increasing the transmittance, and it is also helpful for avoiding the interference of the light emitted by the light-emitting layer 212 itself to the ambient light 4. This makes the detection of ambient light be accurate.

The maximum radial dimension of a light passing hole 111 may be, for example, about 5 μm, about 8 μm, about 10 μm, or about 15 μm, etc.

Here, it is to be noted that when a light passing hole 111 is a circular hole, the maximum radial dimension of the light passing hole 111 refers to diameter of the circular hole; when a light passing hole 111 is a polygonal hole, the maximum radial dimension of the light passing hole 111 refers to diameter of a circumcircle of the light passing hole 111, and the minimum radial dimension of the light passing hole 111 refers to diameter of an inscribed circle of the light passing hole 111, which are understandable to those skilled in the art.

Optionally, the thickness of the light-emitting layer 212 may be 1 μm or less. As a result, structure of the display device 100 is lighter, thinner and more compact.

Referring to FIG. 3 and FIG. 4, the display device 100 further includes a protective layer 5 (such as a protective glass cover, etc.), a packaging layer 6, and a pixel definition layer 7. For example, the protective layer 5 may be disposed on the outermost side of the display screen, and the display screen and the ambient light detection device 1 can be protected by the protective layer 5 in some extent. This helps to allow the accuracy of detection of the ambient light, and to prolong the service life of the display device 100.

The packaging layer 6 may be disposed on the cathode 214, and the pixel definition layer 7 and the anode 213 may be arranged in a same layer. As shown in FIG. 4, the display device may further include a polarizer 23 and a touch screen 24. The touch screen 24 may be bonded to the packaging layer 6 by an optical adhesive. For example, the protective layer 5 may be arranged on the polarizer 23.

Optionally, referring to FIG. 3 and with reference to FIG. 4, the backpanel assembly 21 further includes a back film 215 and a thin film transistor layer 216, the back film 215 is disposed on a lower surface of the substrate 211, and a photoelectric sensor 12 is disposed under the back film 215. The back film 215 may be made of glass, or thermoplastic polyester PET (Polythylene terephthalate), etc. The thin film transistor layer 216 may be arranged between the light blocking layer 11 and the anode 213. The display chip is coupled with the thin film transistor layer 216, and the lightness and darkness of each pixel may be adjusted by the display chip. When light emitted by the light-emitting layer 212 is reflected by the cathode 214 to the light blocking layer 11, in case that the reflected light intersects the light blocking layer 11 at the circumference of a light passing hole 111 (for example, a projection of the light passing hole 111 on the light blocking layer 11 intersects the reflected light), a vertical line perpendicular to the plane where the light blocking layer 11 is located is drawn to go through an intersection of the reflected light and the light blocking layer 11, and an included angle between the vertical line and the reflected light is greater than about 30 degrees. This is more helpful for avoiding the interference of the light emitted by the light-emitting layer 212 itself to the ambient light 4, and so detection of ambient light is accurate.

For example, a light emitted by the light-emitting layer 212 has an intersection with the cathode 214 and is reflected to the light blocking layer 11 via the intersection. The projection of a light passing hole 111 on the light blocking layer 11 is a circle, and the light passing hole 111 has an end point at either end along the diameter direction. The intersection is connected with the end point so as to form a first connecting line, a vertical line perpendicular to the plane where the light blocking layer 11 is located is drawn to go through the end point so as to form a second connecting line, and an included angle between the first connecting line and the second connecting line is greater than about 30 degrees.

Figure 5:
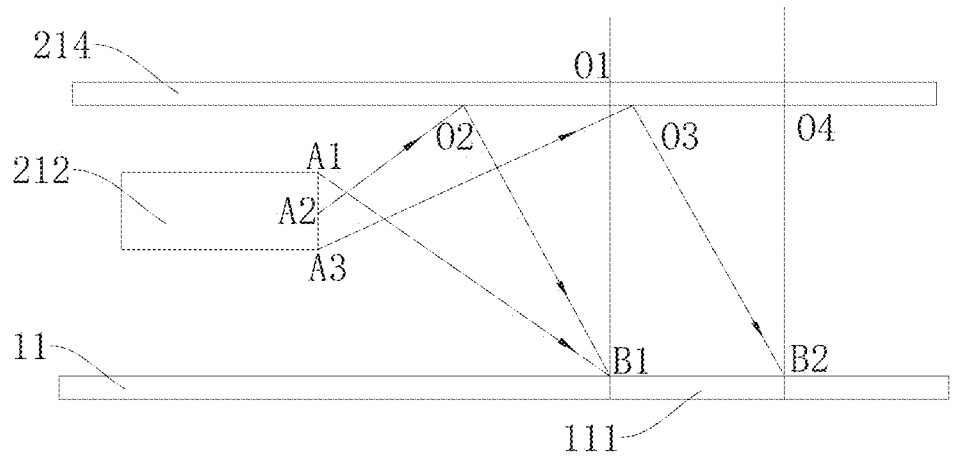
FIG. 5 is a schematic diagram illustrating light propagation path of light beams emitted by a light-emitting layer in a display device according to an embodiment of the present disclosure.

For example, referring to FIG. 5 and with reference to FIG. 3, one point at the margin of an upper surface of the light-emitting layer 212 is A1, one point at the margin of a lower surface of the light-emitting layer 212 is A3, one point at the margin that is situated somewhere between the upper surface and the lower surface of the light-emitting layer 212 is A2, and the end points includes a first end point B1 and a second end point B2.

In case that a light emitted from the point A1 is exited through the first end point B1, a vertical line that goes through the first end point B1 and is perpendicular to the plane where the light blocking layer 11 is located has a first intersection of O1 with the cathode 214, and the first included angle □A1B1O1 (or called as $\theta_1$) is greater than about 30 degrees.

For example, the intersections further include a second intersection O2, a third intersection O3 and a fourth intersection O4. In case that a light emitted by the point A2 is exited from the first end point B1 via the second intersection O2, the second included angle □O2B1O1 (or called as $\theta_2$) is greater than about 30 degrees.

In case that a light emitted by the point A3 is exited from the second end point B2 via the third intersection O3, a vertical line that goes through the second end point B2 has a fourth intersection of O4 with the cathode 214, and the third included angle □O3B2O4 (or called as $\theta_3$) is greater than about 30 degrees.

For example, the ambient light 4 enters the photoelectric sensor 12 through the light passing hole 111 for photosensing, and the photoelectric sensor 12 detects the photosensed energy that is integrated. The control device 3 is coupled with the photoelectric sensor 12 and the display chip, respectively, and determines the intensity of the ambient light 4, and the brightness of the display screen 22 is automatically adjusted by the display chip. Moreover, the light passing hole 111 can play a role of shielding the display device 100, such as an internal light-emitting layer 212 of an OLED (Organic Light-Emitting Diode), from giving off light, so as to avoid stray lights inside the display device 100 interfere with the detection of the photoelectric sensor 12 and resulting in a misjudgment.

As shown in FIG. 3, in order that the light emitted by the light-emitting layer 212 itself can be eliminated by the light passing hole 111 of the light blocking layer 11, it is required that all of the included angles $\theta_1$, $\theta_2$, $\theta_3$ be greater than about 30 degrees, such as 38°, etc., where $\theta_1$, $\theta_2$, and $\theta_3$ satisfies:

$$\theta_1 = \arctan\left(\frac{B}{E}\right),$$
$$\theta_2 = \arctan\left(\frac{B}{(2E-F)}\right),$$
$$\theta_3 = \arctan\left(\frac{A}{(2E-F)}\right),$$

where A denotes the vertical distance between a second light-emitting point and an intersection of a reflected light and a light blocking layer, B denotes the vertical distance between a first light-emitting point and an intersection of a light or a reflected light and the light blocking layer, E denotes the vertical distance between a lower surface of a reflective layer and an upper surface of the light blocking layer, and F denotes the vertical distance between a lower surface of a light-emitting layer and the upper surface of the light blocking layer.

Here, it is to be noted that thickness of the light-emitting layer 212 shown in FIG. 3 to FIG. 5 is very thin, and for illustration, structure of the light-emitting layer 212 and a portion of light rays are schematically drawn in the figure.

According to another embodiment of the present disclosure, the ambient light detection device 1 may further include a low refractivity layer 13.

Figure 6:
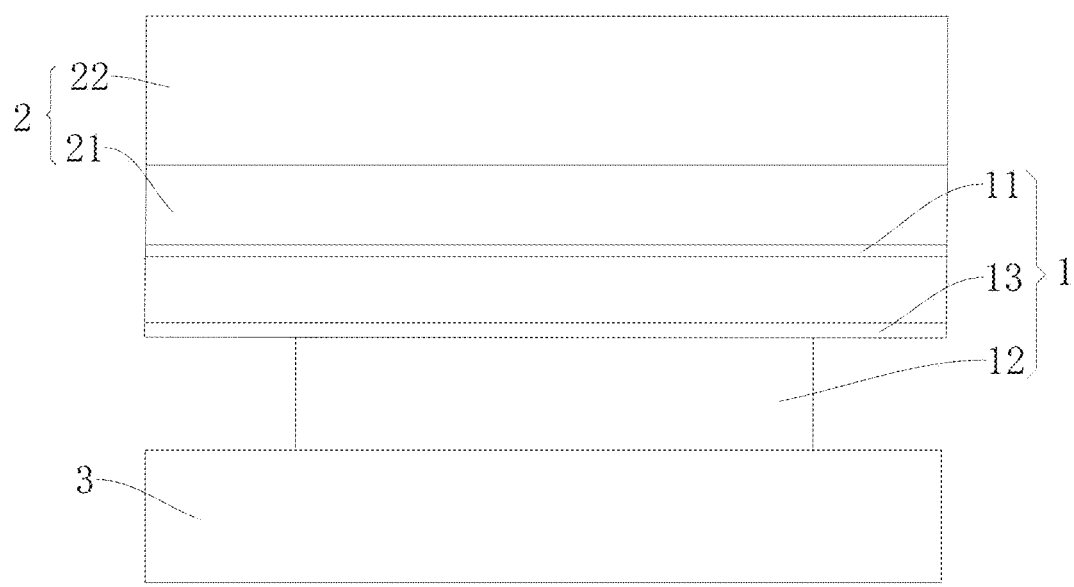
FIG. 6 is a schematic diagram of a display device according to an embodiment of the present disclosure, where another embodiment of an ambient light detection device is shown in the figure.

According to some embodiments of the present disclosure, referring to FIG. 6, the ambient light detection device 1 may further include a low refractivity layer 13 that is arranged between a photoelectric sensor 12 and a substrate 211. The low refractivity layer 13 is configured to allow the ambient light to pass through, and to allow the light emitted by a light-emitting layer 212 to be totally reflected when travelling to the low refractivity layer 13.

Figure 7:
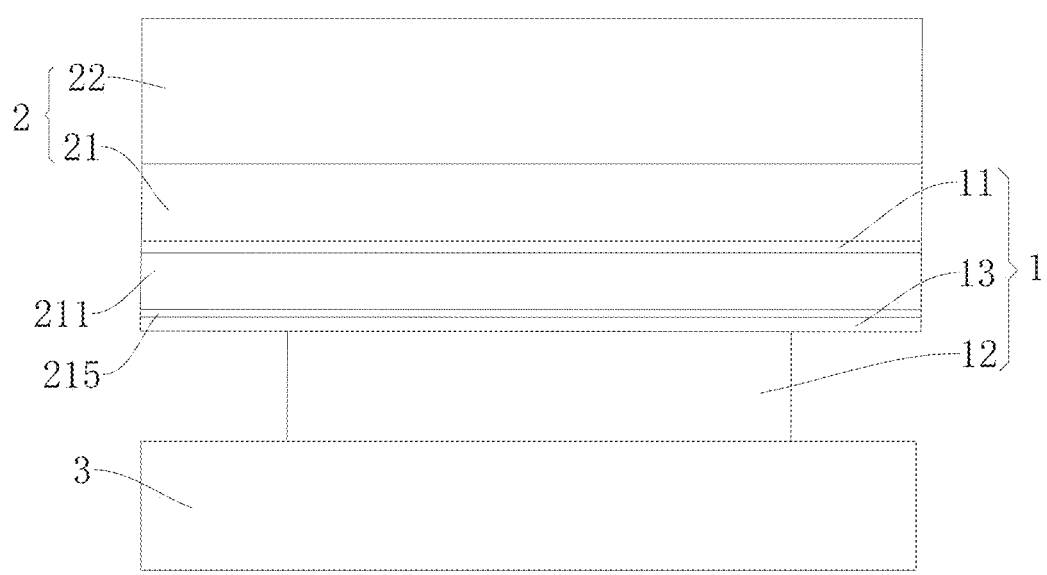
FIG. 7 is a schematic diagram of the display device in FIG. 6.

For example, referring to FIG. 7, a back film 215 is disposed on a lower surface of the substrate 211, and the low refractivity layer 13 may be arranged between the photoelectric sensor 12 and the back film 215.

Optionally, the low refractivity layer 13 may be a silicon dioxide layer, or a bonding layer between the substrate 211 and the photoelectric sensor 12. In addition, a cavity may be defined between the substrate 211 and the photoelectric sensor 12, and the low refractivity layer 13 may be an air layer. The form or material of low refractivity layer 13 may be selected as needed. In this way, after part of light rays emitted by the light-emitting layer 212 is reflected by a cathode 214, if some light rays travel to the photoelectric sensor 12 via a light passing hole 111, these light rays can be totally reflected by the low refractivity layer 13 in this case, which can further reduce interference of light rays emitted by the light-emitting layer 212 itself to the ambient light 4. This more benefits the accuracy of detection of the ambient light.

By reasonably arranging a position of the light passing hole 111, light rays emitted by the light-emitting layer 212 can undergo a total reflection when they travel toward the photoelectric sensor 12 via the light passing hole 111, and the ambient light 4 will not be totally reflected when they travel toward the low refractivity layer 13 through the light hole 111. In this way, the low refractivity layer 13 basically has no effect on the ambient light 4.

For example, the ambient light 4 can be transmitted through the low refractivity layer 13 and arrive at a surface of the photoelectric sensor 12, but the self-emissive light inside the display device 100 will also suffer internal reflection, majority of them will be blocked by the light blocking layer 11, and will not cause any interference. Even if part of light rays emitted by the light-emitting layer 212 is incident into the light passing hole 111 of the light blocking layer 11, their incident angles will be relatively big, and they are totally reflected by the low reflectivity layer 13, and will not reach the surface of the photoelectric sensor 12. In this way, those detected by the photoelectric sensor 12 are basically ambient light 4, and this can make the detection be accurate. As a result, brightness of the display screen 22 can be changed according to brightness variance of ambient light rays, and will not be affected by a display picture of the display device.

Figure 8:
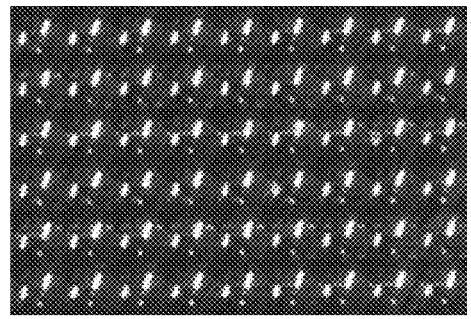
FIG. 8 shows the light energy sensed by a photoelectric sensor, in an indoor bright state, for a display device according to an embodiment of the present disclosure.
Figure 9:
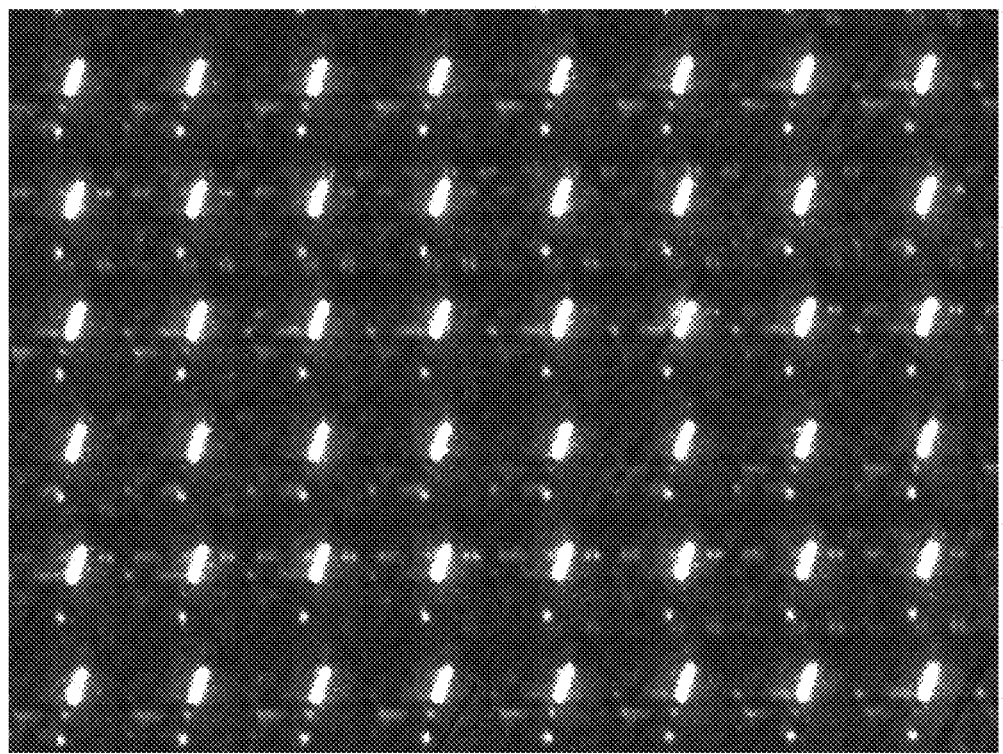
FIG. 9 shows the light energy sensed by a photoelectric sensor, in an indoor slightly dark state (e.g., turning off a part of lamps), for a display device according to an embodiment of the present disclosure.
Figure 10:
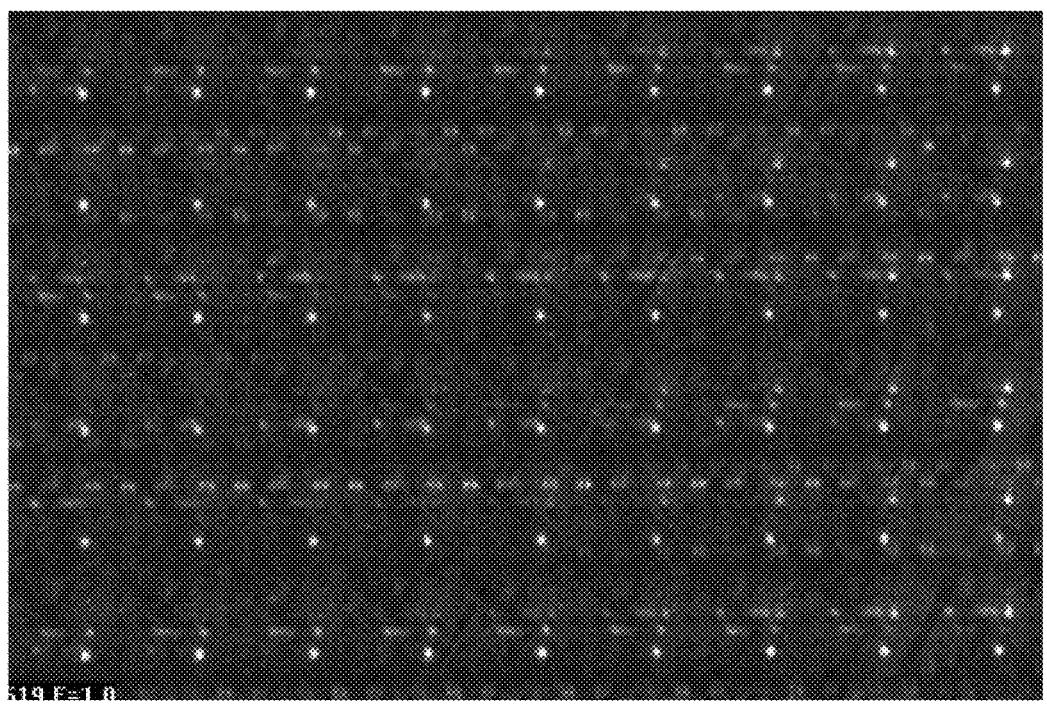
FIG. 10 shows the light energy sensed by a photoelectric sensor, in an indoor slightly dark state (e.g., turning off a part of lamps), and in a white-paper covering state (i.e., a white paper covers a front face of the display screen), for a display device according to an embodiment of the present disclosure.
Figure 11:
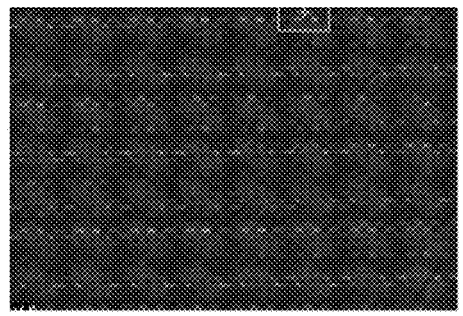
FIG. 11 shows the light energy sensed by a photoelectric sensor, in an indoor light-off state, for a display device according to an embodiment of the present disclosure.

As shown in FIG. 8, it is the light energy sensed by a photoelectric sensor 12 in an indoor bright state; as shown in FIG. 9 and FIG. 10, they are the light energy sensed by the photoelectric sensor 12 in indoor slightly dark states; and as shown in FIG. 11, it is the light energy sensed in an indoor light-off state. All of these tests are performed in a state of lighting screen (that is, a state that the display screen is lit up). It can be seen clearly that, with the change of ambient light 4, the light energy sensed by the photoelectric sensor 12 also changes with it, and no interference is produced to the ambient light 4 in the state that the display screen is lit up.

Figure 12:
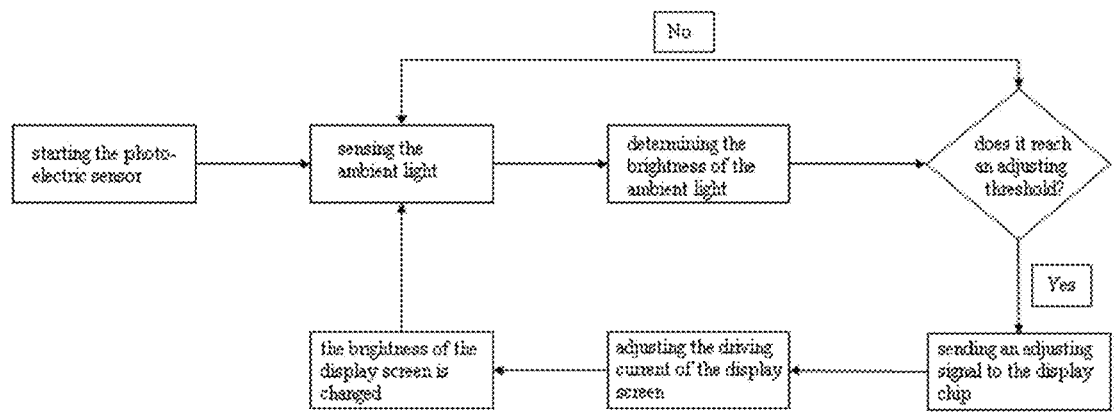
FIG. 12 is a flowchart illustrating an adjustment method for automatically adjusting brightness of a display screen of a display device according to an embodiment of the present disclosure.

Referring to FIG. 12, according to an embodiment of the present disclosure, a method of automatically adjusting the display screen brightness of the above display device is also provided. The photoelectric sensor senses the ambient light, and the control device receives an optical signal sensed by the photoelectric sensor, and compares the optical signal with a signal stored in the display chip. The control device determines whether or not the irradiation intensity of the ambient light reaches an adjusting threshold (which may be set adaptively). If yes, the control device sends an adjusting signal to the display chip, the driving current of the display screen is adjusted by the display chip so as to change the brightness of the display screen, and the photoelectric sensor continues to sense the ambient light; if no, returns to allow the photoelectric sensor to continue to sense the ambient light. In this way, the brightness of the display screen can be adjusted automatically based on the variance of the ambient light, and it is helpful for avoiding the interference of light emitted by the light-emitting layer itself to the ambient light. This makes the detection of the ambient light be accurate.

For example, the optical signal has a corresponding relationship with the signal stored in the display chip. If the optical signal does not match the signal stored in the display chip, it can be determined that the irradiation intensity of the ambient light reaches the adjusting threshold.

Herein, the control device and the photoelectric sensor can be disposed separately, or the control device may be integrated with a comparison module, an analyzing module, or the like, of the photoelectric sensor.

Figure 13:
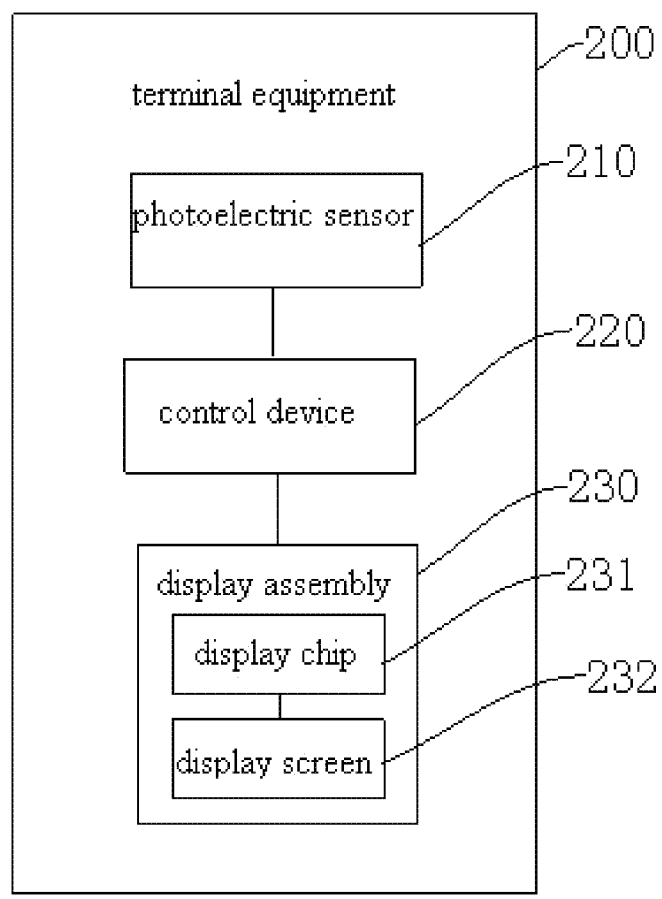
FIG. 13 is a schematic block diagram of a terminal equipment according to an embodiment of the present disclosure.
Figure 14:
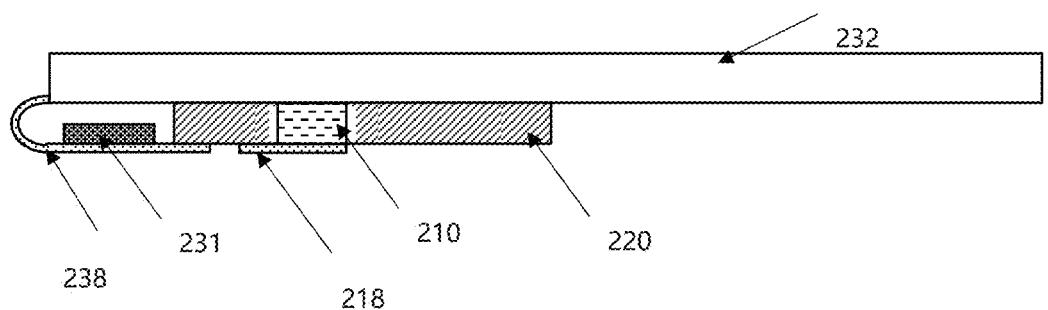
FIG. 14 is a structurally schematic diagram of a terminal equipment according to an embodiment of the present disclosure.

Referring to FIG. 13 and with reference to FIG. 14 and FIG. 15, according to an embodiment of the present disclosure, a terminal equipment 200 is also provided. The terminal equipment 200 is used for carrying out the above process of automatically adjusting the display screen brightness of the display device. The terminal equipment 200 includes a photoelectric sensor 210, a display assembly 230 and a control device 220.

Both the photoelectric sensor 210 and the display assembly 230 are electrically connected to the control device 220, and the display assembly 230 includes a display chip 231 and a display screen 232.

For example, as shown in FIG. 14, the photoelectric sensor 210 is electrically connected to the control device 220 by a sensor Flexible Circuit Board (FPC) 218, and the display assembly 230 including the display chip 231 and the display screen 232 is electrically connected to the control device 220 by a display FPC.

For example, the photoelectric sensor 210 senses the ambient light and acquires an optical signal; and the control device 220 compares the optical signal sensed by the photoelectric sensor 210 with a signal stored in the display chip 231, and determines whether or not the irradiation intensity of the ambient light reaches an adjusting threshold. If yes, an adjusting signal is sent to the display chip 231. The display chip 231 adjusts a driving current of the display screen 232 according to the adjusting signal, so as to change the brightness of the display screen 232.

With respect to the terminal equipment 200 according to the embodiment, the brightness of the display screen 232 can be adjusted adaptively according to the variance of the ambient light, and this helps to improve the user's comfort experience.

It is to be noted that, in order to represent composition of the terminal equipment 200 more clearly, different reference numerals are uses for elements in the terminal equipment 200 with the same name as those in the display device 100.

Regarding other structures and operations of the display device according to embodiments of the present disclosure, a common design can be referred, and they will not be repeated here.

In the description of this specification, reference terms "an/one embodiment", "some embodiments", "an/one example", or "some examples" refers to that elements, structures, materials, or characteristics described in combination with the embodiment(s) or example(s) are contained in at least one embodiment or at least one example of the present disclosure. In this specification, schematic representations of the above terms are not necessarily aimed at the same embodiment or example. Furthermore, the described elements, structures, materials, or characteristics may be combined in an appropriate manner in any one or more embodiments or examples. In addition, without contradiction with each other, one of ordinary skill in the art can conjoin and combine different embodiments or examples described in this specification, and elements of different embodiments or examples.

The above description is only the exemplary embodiments of the present disclosure for explaining the principle of the present disclosure, and the scope of the present disclosure is not limited thereto. A person of ordinary skill in the art can make various changes and modifications without departing from the principle of the present disclosure, and such changes and modifications shall fall into the scope of the present disclosure.

What is claimed is:

1. A display device, comprising an ambient light detection device including a light blocking layer and a photoelectric sensor, a display assembly, and a control device, the display assembly comprising:
   a backpanel assembly, the light blocking layer being arranged in the backpanel assembly and provided with a light passing hole suitable for the passing of ambient light, the photoelectric sensor being arranged under the backpanel assembly and configured to detect variance of the ambient light;
   a display screen provided over the backpanel assembly;
   a display chip connected with the display screen;
   wherein the control device is connected with the photoelectric sensor to receive and process an optical signal sensed by the photoelectric sensor, and the display chip is connected with the control device, to adjust brightness of the display screen according to variance of the ambient light wherein the backpanel assembly comprises:
   a substrate, the light blocking layer being disposed on an upper surface of the substrate, and the photoelectric sensor being disposed under the substrate;
   a light-emitting layer above the light blocking layer;
   an anode on a lower surface of the light-emitting layer; and
   a cathode on an upper surface of the light-emitting layer;
   wherein the light passing hole is configured to allow light emitted by the light-emitting layer not to travel toward the photoelectric sensor through the light passing hole after they are reflected by the cathode, to eliminate interference of light emitted by the light-emitting layer to the ambient light.

2. The display device according to claim 1, wherein when the light emitted by the light-emitting layer is reflected by the cathode to the light blocking layer, for a reflected light that intersects the light blocking layer at the circumference of the light passing hole, a vertical line perpendicular to a plane where the light blocking layer is located is drawn to go through an intersection of the reflected light and the light blocking layer, and an included angle between the vertical line and the reflected light is greater than about 30°.

3. The display device according to claim 2, wherein the backpanel further comprises:
   a back film on a lower surface of the substrate, the photoelectric sensor being disposed under the back film; and
   a thin film transistor layer between the light blocking layer and the anode.

4. The display device according to claim 3, wherein the ambient light detection device further comprises a low refractivity layer, the low refractivity layer being arranged between the photoelectric sensor and the substrate, and configured to allow the passing of the ambient light, and to allow light emitted by the light-emitting layer to be totally reflected when it travels toward the low refractivity layer.

5. The display device according to claim 4, wherein the low refractivity layer is a silicon dioxide layer, or the substrate and the photoelectric sensor is bonded and a cavity is defined between the bonded substrate and photoelectric sensor, and the low refractivity layer is an air layer.

6. The display device according to claim 5, wherein the light passing hole is a through hole that runs through the light blocking layer along a thickness direction, and the through hole is formed to be a circle hole, or a polygon hole.

7. The display device according to claim 6, wherein a plurality of the light passing holes are provided and arranged in array, and the light passing holes have a maximum radial dimension of about 5 µm to about 15 µm.

8. The display device according to claim 7, wherein the light-emitting layer has a thickness about 1 µm or less.

9. The display device according to claim 8, further comprising a protective layer, a packaging layer, and a pixel definition layer; wherein the protective layer is provided over the ambient light detection device, the packaging layer is provided above the cathode layer, and the pixel definition layer is provided in a same layer as the anode layer.

10. The display device according to claim 4, wherein the low refractivity layer is a silicon dioxide layer, or the substrate and the photoelectric sensor is bonded and a cavity is defined between the bonded substrate and photoelectric sensor, and the low refractivity layer is an air layer.

11. The display device according to claim 1, wherein the backpanel further comprises:
 a back film on a lower surface of the substrate, the photoelectric sensor being disposed under the back film; and
 a thin film transistor layer between the light blocking layer and the anode.

12. The display device according to claim 1, wherein the ambient light detection device further comprises a low refractivity layer, the low refractivity layer being arranged between the photoelectric sensor and the substrate, and configured to allow the passing of the ambient light, and to allow light emitted by the light-emitting layer to be totally reflected when it travels toward the low refractivity layer.

13. The display device according to claim 1, wherein the light passing hole is a through hole that runs through the light blocking layer along a thickness direction, and the through hole is formed to be a circle hole, or a polygon hole.

14. The display device according to claim 13, wherein a plurality of the light passing holes are provided and arranged in array, and the light passing holes have a maximum radial dimension of about 5 µm to about 15 µm.

15. The display device according to claim 1, wherein the light-emitting layer has a thickness about 1 µm or less.

16. The display device according to claim 1, further comprising a protective layer, a packaging layer, and a pixel definition layer; wherein the protective layer is provided over the ambient light detection device, the packaging layer is provided above the cathode layer, and the pixel definition layer is provided in a same layer as the anode layer.

17. A method of automatically adjusting display screen brightness of a display device, wherein display device comprises:
 an ambient light detection device including a light blocking layer and a photoelectric sensor, a display assembly, and a control device, the display assembly comprising:
  a backpanel assembly, the light blocking layer being arranged in the backpanel assembly and provided with a light passing hole suitable for the passing of ambient light, the photoelectric sensor being arranged under the backpanel assembly and configured to detect variance of the ambient light;
  a display screen provided over the backpanel assembly;
  a display chip connected with the display screen;
 wherein the control device is connected with the photoelectric sensor to receive and process an optical signal sensed by the photoelectric sensor, and the display chip is connected with the control device, to adjust brightness of the display screen according to variance of the ambient light, wherein the backpanel assembly comprises:
  a substrate, the light blocking layer being disposed on an upper surface of the substrate, and the photoelectric sensor being disposed under the substrate;
  a light-emitting layer above the light blocking layer;
  an anode on a lower surface of the light-emitting layer; and
  a cathode on an upper surface of the light-emitting layer;
 wherein the light passing hole is configured to allow light emitted by the light-emitting layer not to travel toward the photoelectric sensor through the light passing hole after they are reflected by the cathode, to eliminate interference of light emitted by the light-emitting layer to the ambient light;
the method comprising:
 the photoelectric sensor sensing the ambient light;
 the control device receiving an optical signal sensed by the photoelectric sensor, and comparing the optical signal with a signal stored in the display chip;
 determining whether or not an intensity of the ambient light reaches an adjusting threshold;
 if yes, sending an adjusting signal from the control device to the display chip, adjusting the driving current of the display screen by the display chip to change brightness of the display screen, and continuing to sense the ambient light by the photoelectric sensor; and
 if no, returning to continue to sense the ambient light by the photoelectric sensor.

18. A terminal equipment, wherein the terminal equipment is configured to adjust brightness of a display screen of a display device, wherein the display device comprises: an ambient light detection device including a light blocking layer and a photoelectric sensor, a display assembly, and a control device, the display assembly comprising:
 a backpanel assembly, the light blocking layer being arranged in the backpanel assembly and provided with a light passing hole suitable for the passing of ambient light, the photoelectric sensor being arranged under the backpanel assembly and configured to detect variance of the ambient light;
 the display screen provided over the backpanel assembly;
 a display chip connected with the display screen;
 wherein the control device is connected with the photoelectric sensor to receive and process an optical signal sensed by the photoelectric sensor, and the display chip is connected with the control device, to adjust brightness of the display screen according to variance of the ambient light, wherein the backpanel assembly comprises:
 a substrate, the light blocking layer being disposed on an upper surface of the substrate, and the photoelectric sensor being disposed under the substrate;
 a light-emitting layer above the light blocking layer;
 an anode on a lower surface of the light-emitting layer; and
 a cathode on an upper surface of the light-emitting layer;
 wherein the light passing hole is configured to allow light emitted by the light-emitting layer not to travel toward the photoelectric sensor through the light passing hole after they are reflected by the cathode, to eliminate interference of light emitted by the light-emitting layer to the ambient light;
 wherein the terminal equipment comprises a photoelectric sensor, a display assembly and a control device, wherein both the photoelectric sensor and the display assembly are electrically connected to the control device, and the display assembly includes a display chip and a display screen, wherein the photoelectric sensor is configured to sense ambient light and acquire an optical signal;

the control device is configured to compare the optical signal sensed by the photoelectric sensor with a signal stored in the display chip, and to determine whether or not the irradiation intensity of the ambient light reaches an adjusting threshold, if yes, send an adjusting signal to the display chip; and the display chip is configured to adjust a driving current of the display screen based on the adjusting signal, to change the brightness of the display screen.

19. The terminal equipment according to claim 18, wherein the photoelectric sensor is electrically connected to the control device by a sensor flexible circuit board, and the display assembly is electrically connected to the control device by a display flexible circuit board.

\* \* \* \* \*